Aug. 17, 1971 R. A. REYNOLDS 3,600,333
COMPENSATED DETECTOR MATERIAL AND OF GERMANIUM WITH
MERCURY AND GOLD METHOD OF COMPENSATING SAME
Filed July 6, 1967

INVENTOR
RICHARD A. REYNOLDS

V. Bryan Medlock, Jr.
ATTORNEY

United States Patent Office 3,600,333
Patented Aug. 17, 1971

3,600,333

COMPENSATED DETECTOR MATERIAL OF GERMANIUM WITH MERCURY AND GOLD AND METHOD OF COMPENSATING SAME

Richard A. Reynolds, Richardson, Tex., assignor to Texas Instruments Incorporated, Dallas, Tex.

Filed July 6, 1967, Ser. No. 651,582
Int. Cl. H011 *3/12*
U.S. Cl. 252—501 3 Claims

ABSTRACT OF THE DISCLOSURE

A detector material such as mercury sensitized germanium containing acceptor impurity atoms such as copper and Group III elements which have been compensated by a donor impurity such as gold atoms, and a method of compensating the acceptor impurity atoms in the germanium by doping the germanium with gold.

Figures 1, 2:
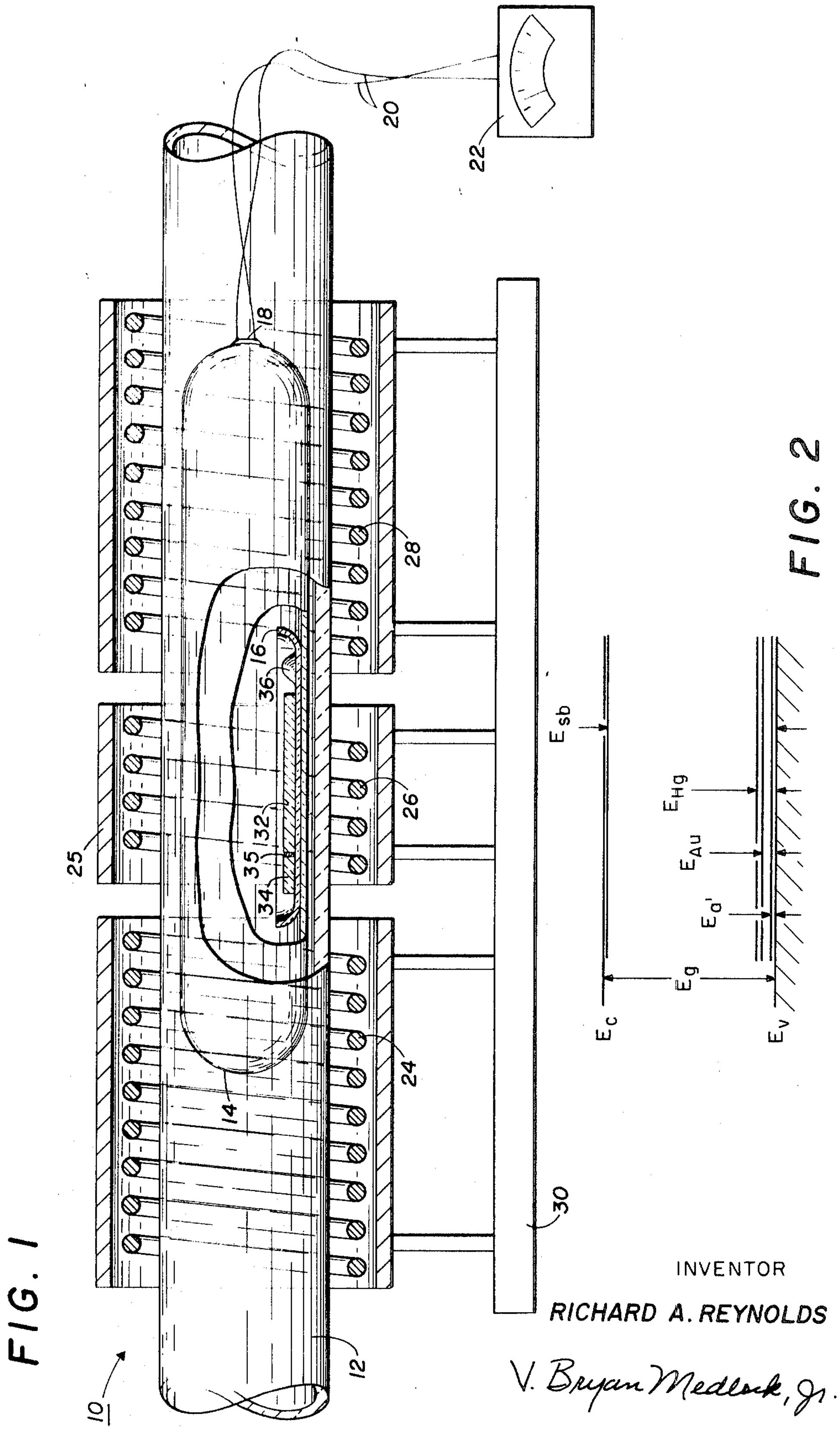

The present invention relates to detector materials in general and to sensitized photocondutive detector materials and their method of preparation in particular.

Sensitized photoconductive detector material such as mercury-doped germanium is used as infrared detector material in various all-weather mapping and surveillance devices. The first mercury-doped germanium which became available for such use had to be maintained at very low temperatures in order to function as an infrared detector. While the theoretical maximum operating temperature at which mercury-doped germanium can be used for this purpose is near 40° K., initial applications required very low temperatures, for example in the liquid helium range, or about 4° K. to 12° K.

Since liquid helium is extremely difficult to handle and does not readily lend itself to airborne applications, it is preferable to operate mercury-doped germanium at 25° K. to 35° K. using either mechanical cooling devices or liquid neon both of which are easier to handle than helium. But at these higher temperatures these mercury-doped germanium semiconductor materials exhibited a long time-constant, and in particular, a long decay period. In other words, if the detector material is subjected to a square infrared pulse, the resulting conductivity of the material is not a square wave as desired, but has an unacceptably long decay tail. For most applications, the detector material must have a time-constant of less than about one microsecond. The long time-constant in the material described above is caused by relatively high concentrations of copper and other shallow acceptors of Group III which are nearly always present in chemically-refined germanium. Copper, in particular, very readily diffuses into and contaminates liquids or solids, particularly at higher temperatures. Although small in quantity, the copper impurities diffusing into the mercury-doped germanium during its manufacture, even the small quantities which may be traced back to the extrusion dies used to make parts of the doping apparatus, are sufficient to contaminate the germanium to such a level as to produce undesirably long time-constants. These acceptor impurities can be compensated to reduce the time-constant, but then the resistance increases to an unacceptable level and detectivity falls off sharply.

Subsequently, photoconductive infrared detector material having an acceptably short time-constant at temperatures in the 27–32° K. range were produced without loss of any other necessary or desired electrical characteristics by starting with chemically-refined germanium, further refining the germanium by a number of molten zone-refining passes to reduce the impurities which act as shallow acceptors to a level on the order of $10^{12}$ atoms/cm.$^3$ or less, compensating the remaining shallow acceptors with shallow donors such as antimony or arsenic, and then doping the germanium with mercury from the vapor state using steps to insure that the germanium was not again contaminated by copper or other shallow acceptor impurities.

The resulting semiconductor material was a single crystal of substantially pure germanium doped with mercury to a level on the order of from $1\times10^{14}$ to $3\times10^{15}$ atoms/cm.$^3$ and having on the order of or less than $10^{12}$ atoms/cm.$^3$ of shallow acceptors such as copper and Group III elements which have been compensated by antimony or arsenic to a level on the order of $10^{13}$ atoms/cm.$^3$.

However, it was found that the method employed to produce antimony or arsenic compensated mercury-doped germanium produced low percentage yields of materials having good detector properties. The low yields of good material resulted from fluctuations in the concentration of background shallow acceptors. Specifically, attempts were made to compensate the shallow acceptor impurities with a slightly excess amount of shallow donor impurities such as antimony or arsenic. A near equality of shallow donor and acceptor impurities was desired since an excess of shallow donors would compensate the sensitizing element, i.e., the mercury acceptor impurities, reducing the photoconductive lifetime of the detector. Reduction of the photoconductive lifetime raises the detector resistance under operating conditions to an unacceptably high value. An excess of shallow acceptors, on the other hand, is undesirable since they tend to become thermally ionized at operating temperatures reducing the signal to noise ratio since the thermally ionized carriers will greatly exceed the number of carriers generated by the incident radiation. Due to fluctuation in the shallow acceptor concentration, however, the desired near equality of shallow acceptor and donor concentrations was difficult to achieve in a high percentage of the grown crystals since some crystals were undercompensated (more shallow acceptors than donors) and others were overcompensated (an undesirable excess of donors).

The present invention provides a compensated detector material which may be produced in good yields, which has relatively low resistance and a relatively short time-constant at operating temperatures and a method for producing the compensated detector material.

The detector material of the present invention may be generally described as a single crystal of a host conductor material having acceptor impurity atoms with ionization energy levels greater than the valence band maximum of the host conductor material. In addition, the host conductor contains atoms of a sensitizing material having an ionization energy level greater than the ionization energy level of the acceptor impurity atoms and atoms of a donor impurity having an ionization energy level located in between the ionization energy level of the acceptor impurity atoms and the ionization energy level of the sensitizing material, the number of the donor impurity atoms being in excess of the number of acceptor impurity atoms. In a specific embodiment of the invention the host conductor material may be germanium, the sensitizing material mercury, the acceptor impurity atoms copper and Group III elements and the donor impurity gold.

The inventive method may be generally described as a method of compensating impurity atoms in a sensitized detector of energy waveforms such as infrared rays by doping a host conductor material with donor impurity atoms having an ionization energy level located in between the ionization energy level of the acceptor impurity atoms and the ionization energy level of the sensitizing material, the number of donor atoms added being in excess of the number of acceptor impurity atoms.

To be more specific, reference is made to the drawing, in which:

FIG. 1 is a schematic drawing of a horizonal zone-refining apparatus which may be used to carry out the process or method of the present invention; and FIG. 2 is a schematic energy band diagram.

Referring now to FIG. 1, a standard horizontal zone-refining apparatus of the type using a sealed bomb-tube is indicated generally by the reference numeral 10. The apparatus 10 comprises a stationary quartz support tube 12 which is sized to receive a sealed quartz bomb-tube 14 in which is located a quartz boat 16, both of which will hereafter be described in greater detail. A suitable temperature-sensing means 18, such as a thermocouple, is attached to one end of the bomb-tube 14 and is connected by electrical leads 20 to a suitable temperature indicator 22. Three resistive heating coils 24, 26 and 28 are disposed around the support tube 12. The coils 24, 26 and 28 may be resistive wire heaters surrounded by suitable insulation 25. Alloy K wire is suitable for use as the resistive heating coils. The outer coils 24 and 28 are used to maintain the bomb-tube 14 at a temperature below the melting point of a conductor material such as germanium, the melting point of which is about 958° C., and the center heater 26 is used to establish a molten zone in the conductor material. The coils are supported by a gear-driven platform 30, which may be propelled at a very slow rate longitudinally along the support tube 12 so that the molten zone established by the center heating coil 26 may be passed through a conductor disposed in the boat 16 for purposes which will hereafter be described in detail.

The composition of the bomb-tube 14 and boat 16 and the preparation of these parts of the process apparatus is important because each must be a high purity material free from the customary traces of copper which can be found in almost all manufactured products as a result of diffusion from extrusion dies and other manufacturing equipment. The bomb-tube 14 may be a standard G.E. clear fused quartz bomb-tube having a 22 mm. ID with walls 2 mm. thick. These bomb-tubes are 20 inches long and domed off at one end prior to being loaded and sealed off under vacuum as will presently be described. The boat 16 should be a clear fused synthetic quartz boat. An example of a suitable boat is one sold by Thermal American Quartz Company of Montville, New Jersey, under the trademark "Spectroseal," or an equivalent. These boats are manufactured in such a manner as to exclude detectable traces of copper and these boats have been successfully used to carry out the process of the present invention.

The inside surface of the boat 16 is sandblasted to prevent wetting by molten conductor material so that a single crystal can be formed as a molten zone is passed through a conductor bar. The boat 16 and the bomb-tube 14 are thoroughly degreased with trichloroethylene followed by a methyl alcohol rinse. Then the boat and bomb-tube are soaked in full strength hydrofluoric acid for ten minutes to etch away the surface layer of the quartz material and remove any traces of copper which may have wiped off on the parts during manufacturing, handling, or shipping, then rinsed in 16 meg-ohm or better water. Next the bomb-tube and boat are soaked in strong sodium hydroxide solution for 30 minutes to leach the surface and further remove any copper impurities, then again rinsed in 16 meg-ohm or better water. Next the bomb-tube and boat are soaked in full strength hydrochloric acid for 30 minutes to further insure that all residual sodium hydroxide and copper solution is removed, and again rinsed in 16 meg-ohm or better water. The boat is then allowed to dry between two sheets of bibulous paper. The bomb-tube is hung with the open end down and excess water drained from within the tube. No further drying of the tube is necessary or should be attempted because to do so would likely result in contamination of the interior of the bomb-tube.

Once the apparatus has been prepared as described above, the starting materials which may comprise a germanium bar 32, a single crystal germanium seed 34, gold flakes 35 and mercury 36 are placed in the boat 16 in the manner illustrated in the drawing. The germanium bar is cut from a high purity single crystal which has been zone refined a plurality of times. A germanium bar of acceptable purity will have electrical properties in the approximate ranges detailed in Table I.

TABLE I

Electrical data at 300° K.

$\rho$ from 45 to 55 ohm cm.

$R_H$(B=5000 gauss from $-8\times10^4$ to $-1.3\times10^5$ cm.$^3$/coulomb

Electrical data at 77° K.

$\rho$ from 300 to 3000 ohm cm.

$R_H$(B=5000 gauss) from $\pm3\times10^6$ to $\pm10^8$ cm.$^3$/coulomb

The single crystal seed is preferably obtained from a mercury-doped germanium crystal which has previously been manufactured in accordance with the process of the present invention, which has been tested as a photoconductive infrared detector and which has been found to have an acceptably short-time-constant. When such a seed is not available, a single crystal seed of the highest purity mercury-doped or undoped germanium available may be used. Only very high purity mercury should be used. New, triple-distilled mercury has been successfully used. The gold which is used should be at least 99.99 weight percent pure.

The mercury-doped germanium seed and germanium bar are degreased with trichloroethylene followed by a methyl alcohol rinse, then etched in CP–4 solution for 20–30 seconds. The CP–4 solution is a mixture comprised of, by volume, 25% acetic acid, 25% hydrofluoric acid, and a 50% solution of nitric acid and bromine. The nitric acid-bromine solution is comprised of about 10–15 drops of bromine in 250 cc. of nitric acid and should not be mixed with the acetic and hydrofluoric acids until just before the CP–4 is to be used. The CP–4 solution etches away the surface layer of the seed and germanium bar and thereby insures that any copper which may have contaminated the surface of the materials as the crystals were cut to the desired shape will be removed. The bar and seed are then rinsed in 16 meg-ohm or better water. Next, the germanium seed crystal and germanium bar are soaked in a 50% by volume solution of hydrochloric acid and water for about ten minutes to further remove any copper which may have been left by the CP–4 solution on the surface of the crystals, then rinsed with 16 meg-ohm or better water and allowed to dry between two sheets of bibulous paper.

The germanium bar 32, the single crystal seed 34, mercury 36, and gold 35 are placed in boat 16 in the general positions indicated in the drawing. The gold is placed at the junction of the pure germanium bar 32 and the single crystal seed 34. The bomb-tube 14 is then positioned horizontally and the boat 16 inserted with the seed next to left end of the bomb-tube as viewed in FIG. 1. The opposite or open end of the bomb-tube 14 is then connected to a vacuum system and a vacuum pulled on the tube. A good mechanical vacuum pump with a cold trap is sufficient since the primary purpose is to reduce the pressure within the tube and remove substantially all of the volatile impurities, including the water and oxygen from within the bomb-tube. For example, a vacuum of about one micron of mercury has been found adequate. The bomb-tube is then sealed by heating the bomb-tube adjacent the open end and constricting the heated portion until a seal is accomplished. The vacuum should be maintained as the bomb-tube is sealed so that any impurities volatilized as a result of heating the bomb-tube will be withdrawn from the tube. The thermocouple 18 or other heat-sensing device is then placed against the end of the bomb-tube 14 and the bomb-tube inserted in the support tube 12 of the horizontal zone-refining apparatus 10.

The resistive heaters 24, 26 and 28 are then energized. The heater 28 is adjusted until the end of the bomb-tube 14 is at a temperature in excess of 500° C., but less than the melting point of germanium, so that the temperature adjacent the thermocouple 18 will be the coldest spot on the bomb-tube 14, and will therefore control the vapor pressure of the mercury. As the bomb-tube is heated, the mercury in the boat 16 vaporizes and recondenses as a pool at the cold spot adjacent the thermocouple 18. A sufficient volume of mercury must be placed within the bomb-tube to always maintain a pool of condensed mercury at the cold spot. Unless a small pool of condensed mercury is visible on the end of the bomb-tube adjacent the thermocouple 18, either an insufficient quantity of mercury is present within the bomb-tube, or the bomb-tube 14 has another point which is at a lower temperature. The temperature of the pool of condensed mercury determines the vapor pressure of the mercury within the bomb-tube, which in turn determines the doping level of the mercury in the germanium. Therefore, it is very important that the point adjacent the thermocouple 18 be the coldest point of the bomb-tube and be maintained at the predetermined temperature which will produce the desired doping level of mercury. The proper temperature can be determined empirically after a few runs.

The center heater 26 should be adjusted until the temperature of the end of germanium bar 32 adjacent the gold 35 and germanium seed crystal 34 exceeds 1000° C. so as to produce a molten zone between the seed and the bar. The extent to which the temperature exceeds the melting point will determine the width of the molten zone. The gold will dissolve in the molten zone as it is formed. After a molten zone has been established, the mercury vapor within the bomb-tube 14 will diffuse into the molten zone until an equilibrium concentration of mercury is established in the germanium, which will determine the ultimate concentration of mercury in the final germanium crystal. Since the equilibrium concentration is a function of the vapor pressure of the mercury and therefore is directly related to the temperature of the cold spot on the bomb-tube adjacent the thermocouple 18, the temperature of the cold spot determines the doping level. The molten zone is then carried through the length of the germanium bar 32 by moving the platform 30 and heaters 24, 26 and 28 longitudinally relative to the bomb-tube 14 and boat 16 so that the gold and mercury will be dissolved throughout the germanium bar 32 by the process of zone leveling. Care should be taken to maintain the temperature of the cold spot on the bomb-tube 14 at the predetermined level in order to maintain the vapor pressure of the mercury constant and thereby obtain a constant mercury doping level over the length of the germanium bar. After the molten zone has been carried through the germanium bar, the three heating elements 24, 26 and 28 are turned "off" and the bomb-tube 14 and the boat 16 should be allowed to cool slowly under the heaters to prevent thermal fracture of the germanium crystal.

Mercury concentrations as high as about $3\times10^{15}$ atoms/cm.$^3$ have been obtained using the described process with a cold spot temperature of about 500° C., which results in a mercury vapor pressure of about nine atmospheres. Equipment which will handle higher pressures could be expected to yield higher mercury levels.

To further illustrate the invention, reference is here made to the following examples.

EXAMPLE I

In a boat, such as boat 16, were placed a pure, undoped single crystal germanium seed (4.7 grams), a pure, undoped single crystal germanium bar (40.1 grams), mercury (5.0 grams) and gold flakes (298.6$\mu$ grams). A molten zone was established at the juncture of the seed and bar as described above and moved longitudinally through the bar. The temperature of the cold end of bomb-tube 14 was maintained at about 515° C.

The germanium material after being doped with the mercury and gold was cooled and Hall effect bars cut from the material. The electrical properties of the resulting detector material is listed in Table II below.

TABLE II

Electrical properties at 300° K.

$\rho$=1.1 ohm cm.
$R_H$ (B=5000 gauss)=$+3.6\times10^3$ cm.$^3$/coulomb

Electrical properties at 77° K.

$\rho$=3.4 ohm cm.
$R_H$ (B=5000 gauss)=$+1.3\times10^5$ cm.$^3$/coulomb

The infrared detector properties of the material for a 50° field of view and a 300° K. background temperature are listed in Table III.

TABLE III

| Sample No. | 1 | 2 |
|---|---|---|
| Detectivity, $D^*_{BB}$ (500, 900, 1) cm. c.p.s.$^{1/2}$/watt | $2.0\times10^{10}$ | $2.0\times10^{10}$ |
| Resistance, $R_1$ (ohms) | $1\times10^5$ | $1\times10^5$ |

The photoresponse time was measured as a function of temperature and found to be between one and two microseconds in the operating temperature range (T$\lesssim$40° K.)

EXAMPLE II

The test of Example I was repeated with essentially the same weight of all starting materials, except 1050$\mu$ grams of gold was used.

The electrical properties of the resulting detector material is detailed in Table IV.

TABLE IV

Electrical properties at 300° K.

$\rho$=2.15 ohm cm.
$R_H$ (B=5000 gauss)=$+8.4\times10^3$ cm.$^3$/coulomb

Electrical properties at 77° K.

$\rho$=5.6 ohm cm.
$R_H$ (B=5000 gauss)=$2.34\times10^5$ cm.$^3$/coulomb

The infrared detector properties of the material for a 50° field of view and a 300° K. background temperature was measured and the results are detailed in Table V.

TABLE V

| | |
|---|---|
| Detectivity, $D^*_{BB}$ (500, 900, 1) cm. c.p.s.$^{1/2}$ watt | $1.7\times10^{10}$ |
| Resistance, R (ohms) | $2\times10^5$ |

The photoresponse time was measured as a function of temperature and found to be less than 1 microsecond in the operating temperature range (T$\lesssim$40° K.)

The quantity of gold with which the germanium may be doped is relatively unimportant as long as a sufficient quantity is added to compensate the shallow acceptors present in the germanium. For example, if the garmanium contains a concentration of $1\times10^{13}$ acceptors atoms per cm.$^3$ of germanium, then sufficient gold should be zone leveled into the germanium to provide in excess of $1\times10^{13}$ gold atoms per cm.$^3$ of germanium. An excess of gold is preferably incorporated into the germanium to assure compensation of all shallow acceptors, and an excess of gold due to its ionization energy level will not compensate the sensitizing element, mercury, as is true when antimony or arsenic are used as compensating donors. This phenomenon can perhaps best be understood by reference to FIG. 2 of the drawing.

In FIG. 2:

$E_V$ represents the energy band level of the germanium valence band or valence band maximum energy level, $E_c$ represents the energy level of the germanium conduction band, $E_g$ represents the energy gap between the valence band and conduction band which is approximately 0.7 ev. for germanium, $E_{a'}$ represents the ionization energy level of the shallow acceptors such as copper and Group III impurities which are termed "shallow" acceptors since their energy level is approximately 0.01 ev. to 0.04 ev. above $E_V$, $E_{au}$ represents the donor ionization energy level of gold which is about 0.05 ev. above $E_V$, $E_{Hg}$ represents the ionization energy level of the mercury which is about 0.09 ev. above $E_V$, $E_{Sb}$ represents the energy level of antimony which is about 0.69 ev. above $E_V$ or 0.01 ev. below $E_c$.

In prior art detector material which had been sensitized with mercury and compensated with antimony or arsenic (the ionization energy level of arsenic lies about 0.0687 ev. above $E_V$), the compensating donor atoms, i.e. antimony or arsenic atoms, due to their high ionization energy level not only compensated the shallow acceptors, but would serve to compensate the mercury atoms if an excess of the antimony or arsenic were present. However, since the energy level of gold, while greater than that of the shallow acceptors, is less than that of mercury, the gold, even though present in excess amount will not compensate the mercury atoms. The detectivity of the gold compensated sensitized germanium is thus not unfavorably affected by an excess of gold, nor is the resistance unfavorably affected as is evident from the above tables.

By incorporating an excess quantity of gold in the germanium material during manufacture, the percentage of under-compensated crystals is reduced thus rendering more economical the production of detector materials. Of course the production of overcompensated material is of no concern since an excess quantity of gold does not compensate the mercury employed to sensitize the germanium to infrared rays.

While the examples have been directed to mercury sensitized germanium, the invention is equally applicable to other sensitized detector materials such as cadmium doped germanium. Gold also has an ionization energy level less than that of cadmium (cadmium having an ionization energy level which is 0.056 ev. above the valence band of germanium) and thus would serve to compensate the shallow acceptors in a germanium detector material doped with cadmium. Indeed, the invention need not be limited to the use of gold as a compensating element, but is as applicable to the use of any compensating element having an energy level greater than the acceptors to be compensated and less than that of the sensitizing element whether the host crystal is germanium or silicon.

While rather specific terms have been used to describe various embodiments of the invention, they are not intended nor should they be construed as a limitation on the invention as defined by the claims.

What is claimed is:

1. A method of compensating acceptor impurity atoms in a sensitized detector of energy waveforms, the detector comprising a host conductor material of germanium, said germanium containing acceptor impurity atoms in the order of about $1\times10^{12}$ atoms/cm.$^3$, said germanium also containing sensitizing atoms of mercury in the range of $1\times10^{14}$ to $3\times10^{15}$ atoms/cm.$^3$, said atoms of mercury having an ionization energy level greater than the valence band maximum of germanium and greater than the ionization energy level of the acceptor impurity atoms, by doping said germanium with gold donor impurity atoms, the ionization energy level of which is in excess of the ionization energy level of the acceptor impurity atoms but less than the ionization energy level of the sensitizing mercury atoms, said gold donor impurity atoms being added in an amount in excess of the number of said acceptor impurity atoms.

2. A method of preparing a mercury sensitized germanium detector material comprising the steps of:

placing a single crystal seed of germanium on a suitable non-reactive surface;

positioning a refined body of crystalline germanium upon said non-reactive surface and in proximate abutting relationship with said single crystal seed, said refined body of crystalline germanium having acceptor impurity atoms in the order of $1\times10^{12}$ atoms/cm.$^3$ or less;

placing a desired quantity of gold between said single crystal seed of germanium and said refined body of crystalline germanium;

enclosing said single crystal seed, said refined body of germanium and said gold in a chamber with a desired quantity of mercury; and establishing a molten zone through the refined body to simultaneously dope said germanium with gold and mercury, said germanium being doped with mercury in the order of $1\times10^{14}$ to $3\times10^{15}$ atoms/cm.$^3$ and with gold in an amount in excess of the number of said acceptor impurity atoms.

3. A sensitized detector material for detecting energy waveforms comprising:

a single crystal of a germanium host conductor having acceptor impurity atoms in the order of $1\times10^{12}$ atoms/cm.$^3$, said impurity atoms having ionization energy levels greater than the valance band maximum of the host conductor, atoms of mercury as a sensitizing material in the order of $1\times10^{14}$ to $3\times10^{15}$ atoms/cm.$^3$, said atoms of mercury having an ionization energy level greater than the ionization energy level of the acceptor impurity atoms, and gold donor impurity atoms having an ionization energy level greater than the ionization energy level of the acceptor impurity atoms and less than the ionization energy level of the sensitizing material, the number of said impurity atoms serving as donors being in excess of the number of acceptor impurity atoms.

References Cited

UNITED STATES PATENTS

| | | | |
|---|---|---|---|
| 2,701,326 | 2/1955 | Pfann et al. | 252—62.3 |
| 2,588,253 | 3/1952 | Park-Horovitz et al. | 252—62.3 |
| 2,844,737 | 7/1958 | Hahn et al. | 252—501 |
| 2,953,529 | 9/1960 | Schultz | 252—501 |
| 3,382,114 | 5/1968 | Beauzee et al. | 252—62.3 |

GEORGE F. LESMES, Primary Examiner

J. P. BRAMMER, Assistant Examiner

U.S. Cl. X.R.

252—62.3